United States Patent

Okochi et al.

[11] Patent Number: 6,135,200
[45] Date of Patent: Oct. 24, 2000

[54] HEAT GENERATING ELEMENT COOLING UNIT WITH LOUVERS

[75] Inventors: Takaki Okochi, Kariya; Hiroo Yamaguchi, Toyohashi; Takayuki Hayashi, Nagakute-cho; Kazuaki Kafuku, Chiryu, all of Japan

[73] Assignee: Denso Corporation, Kariya, Japan

[21] Appl. No.: 09/264,906

[22] Filed: Mar. 9, 1999

[30] Foreign Application Priority Data

Mar. 11, 1998 [JP] Japan ................................. 10-060185
Dec. 17, 1998 [JP] Japan ................................. 10-359541

[51] Int. Cl.[7] ................................................... H05K 7/20
[52] U.S. Cl. ......................... 165/121; 165/80.3; 361/697
[58] Field of Search .................................. 165/80.3, 121, 165/122, 185; 361/704, 710, 697

[56] References Cited

U.S. PATENT DOCUMENTS

| | | |
|---|---|---|
| 5,077,601 | 12/1991 | Hatada et al. ............................. 357/81 |
| 5,494,098 | 2/1996 | Morosas . |
| 5,701,951 | 12/1997 | Jean ........................................ 165/121 |
| 5,828,551 | 10/1998 | Hoshino et al. ......................... 361/697 |
| 5,957,194 | 9/1999 | Azar ....................................... 165/80.3 |
| 6,021,844 | 2/2000 | Batchelder ............................. 165/80.3 |

FOREIGN PATENT DOCUMENTS 63-164294  10/1988  Japan .

*Primary Examiner*—Allen Flanigan
*Attorney, Agent, or Firm*—Pillsbury Madison & Sutro LLP

[57] ABSTRACT

A square substrate is divided into four substrate areas with reference lines respectively passing through a central point of the substrate in parallel with one of diagonals of the substrate. A fin disposed between the substrate and an axial fan has plural louvers each facing one of the substrate areas and extending in a direction parallel to a corresponding reference line of the one of the substrate areas. Accordingly, when air is blown out from the axial fan toward the substrate, an air flow direction can be changed by the louvers so that the air radially flows out from the central point of the substrate. As a result, a heat spot is not produced on the substrate.

19 Claims, 6 Drawing Sheets

FAN ROTATING DIRECTION

FAN ROTATING DIRECTION

HEAT GENERATING ELEMENT COOLING UNIT WITH LOUVERS

CROSS REFERENCE TO RELATED APPLICATIONS

This application is based upon and claims the benefit of Japanese Patent Applications No. 10-60185, filed on Mar. 11, 1998, No. 10-359541 filed on Dec. 17, 1998.

BACKGROUND OF THE INVENTION

1. Field of the Invention

This invention relates to a cooling unit for cooling heat generating electronic elements (components) such as a micro processor and an inverter.

2. Description of the Related Art

JP-U-63-164294 discloses a cooling unit shown in FIGS. 10A and 10B. The cooling unit includes plural cooling fins (herebelow, referred to as fins) 320 disposed on a substrate 300 to which electronic components are joined, and an axial fan 310 for blowing cooling air toward the fins 320.

The inventors of the present invention have examined a radiation (cooling) capacity of the cooling unit described above. As a result, it was founded that a temperature at the generally central portion of the substrate 300 was higher than those at the other portions, i.e., a so-called hot-spot was produced at the central portion of the substrate 300. This implies that the cooling unit must adopt a large fan to prevent the hot-spot, resulting in increased size, increased noise, and increased manufacturing cost.

SUMMARY OF THE INVENTION

The present invention has been made in view of the above problem. An object of the present invention is to provide a heat generating element cooling unit capable of preventing a hot-spot from arising on a substrate.

In a cooing unit according to the present invention, a substrate is divided into even substrate areas respectively having reference lines, each of which radially extends from a specific point of the substrate, and a cooling fin disposed between a substrate and an axial fan has a plurality of louvers each facing one of the substrate areas and extending in a direction parallel to a corresponding reference line of the one of the substrate areas. Each of the reference lines makes a specific angle with an adjacent reference line thereof. Preferably, the specific point is a central point of the substrate, and the axial fan is disposed with a boss part facing the central point.

Accordingly, when air is blown from the axial fan toward the substrate, an air flow direction of the air can be changed by the louvers in directions parallel to the reference lines of the respective substrate areas. As a result, the air radially and smoothly flows out from the cooling unit. Heat is also radially transferred from the central point of the substrate toward outside, thereby preventing occurrence of a hot-spot.

The axial fan may be a suction type which blows out air on a side opposite the cooling fan. In this case, the air can flow out from the cooling unit after smoothly flowing in the cooling fin in directions parallel to the reference lines of the respective substrate areas toward the central point.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS (First Embodiment)

Figure 1:
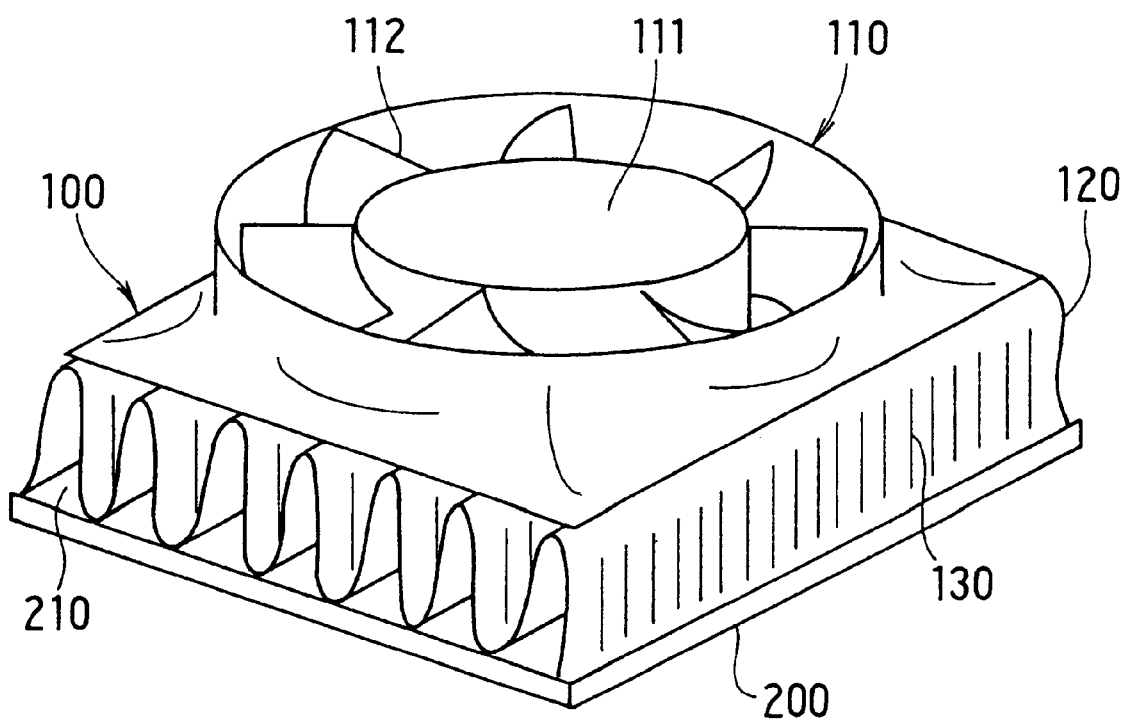
FIG. 1 is a perspective view showing a coolign unit in a first preferred embodiment.

A cooling unit 100 in a first preferred embodiment is suitable for cooling heat generating electronic components such as a micro processor (MPU). Referring to FIG. 1, the cooling unit 100 includes a square substrate 200 made of non-ferrous metal such as aluminum. The electronic parts can be joined to the generally central portion of the substrate 200 on a side opposite cooling fins (herebelow, referred to as fin) 120 specifically described below. The cooling unit 100 further includes an axial fan (herebelow, referred to as fan) 110 for blowing cooling air toward a substrate surface 210 of the substrate 200 in a direction approximately perpendicular to the substrate surface 210. The fan 110 is composed of a boss part 111 and several blades 112 disposed around the boss part 111. An electric motor (not shown) for driving the fan 110 is disposed in the boss part 111. The fins 120 that are formed into a corrugated shape as a whole by a roller are disposed between the fan 110 and the substrate 200 (substrate surface 210), with plural louvers 130 thereon for changing an air flow direction to specific directions. The fins 120 are brazed to the substrate surface 210.

Next, the directions of the louvers 130, i.e., the specific directions into which air flow direction is changed by the louvers 130 will be described. Incidentally, the directions of the louvers 130 represent communicating directions of air whose flow direction is changed by the louvers 130 to be parallel to the substrate surface 210 as shown by arrows D in FIG. 2. The directions of the louvers 130 further represent directions in which the louvers 130, which are formed by cutting and bending up the fins 120, respectively extend.

Figure 2:
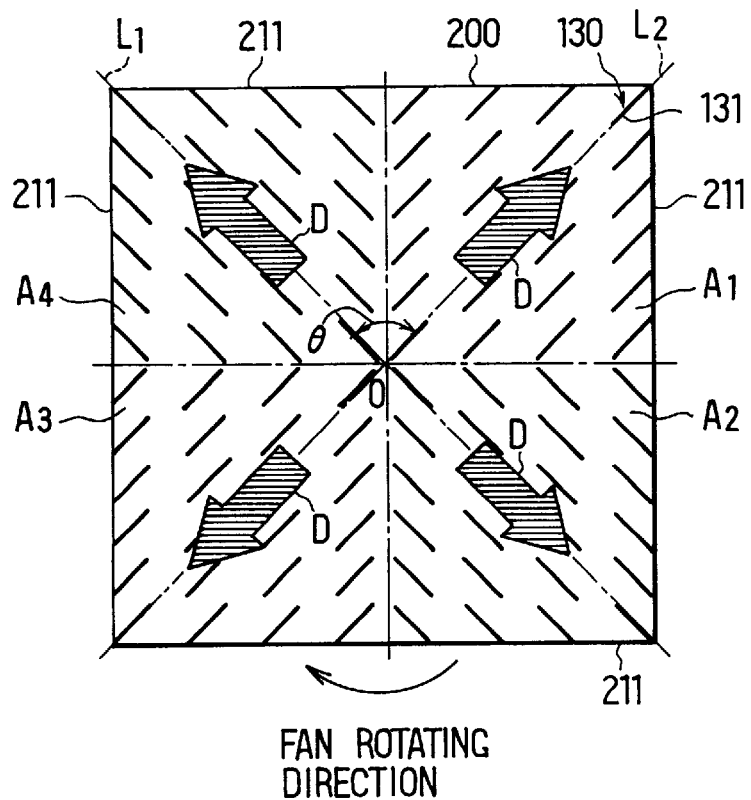
FIG. 2 is a schmatic view showing an arrangement of louvers relative to a substrate in the first embodiment.

Referring to FIG. 2, the substrate 200 is divided into even (four in this embodiment) areas $A_1$ to $A_4$ around the central point O in a direction (fan rotating direction) in which the fan 110 rotates. The central point O corresponds to the boss part 111 and to an intersection between diagonals of the substrate 200. The louvers 130 respectively belonging to the areas $A_1$ to $A_4$ are arranged in parallel with one another in the corresponding areas $A_1$ to $A_4$. Each of the areas $A_1$ to $A_4$ has at least a louver 130 radially extending therein from the central point O in direction D parallel to one of reference lines $L_1$, $L_2$. The reference lines $L_1$, $L_2$ correspond to the diagonals in this embodiment, and therefore, each direction D makes an angle of 45° C. relative to one of the outer sides 211 of the substrate 200.

Next, features and effects in this embodiment will be specifically explained. In the cooling unit according to the first embodiment, the substrate 200 is divided into the areas $A_1$ to $A_4$ around the central point O corresponding to the boss part 111. In the respective areas $A_1$ to $A_4$, the direction D of the louvers 130 is parallel to either one of the reference lines $L_1$, $L_2$ (diagonals) extending radially from the central points O. Therefore, the direction D of the louvers 130 in one of the areas $A_1$ to $A_4$ forms an angle θ with the direction D of the louvers 130 in the adjacent one of the areas $A_1$ to $A_4$. The angle θ is defined by the reference lines $L_1$, $L_2$, and is 90° in this embodiment.

The louvers 103 in the adjacent two of the areas $A_1$ to $A_4$ are arranged with V-like shapes protruding toward the central point O. Therefore, the cooling air blown from the fan 110 toward the fins 120 in a direction perpendicular to the substrate 200 flows from the central points O toward the outer sides 211 in the directions D in the respective areas $A_1$ to $A_4$, and then flows out from the cooling unit 100. Accordingly, heat at the central portion is radially transmitted toward the outside, thereby preventing a hot-spot from being generated on the substrate 200.

Figure 10A:
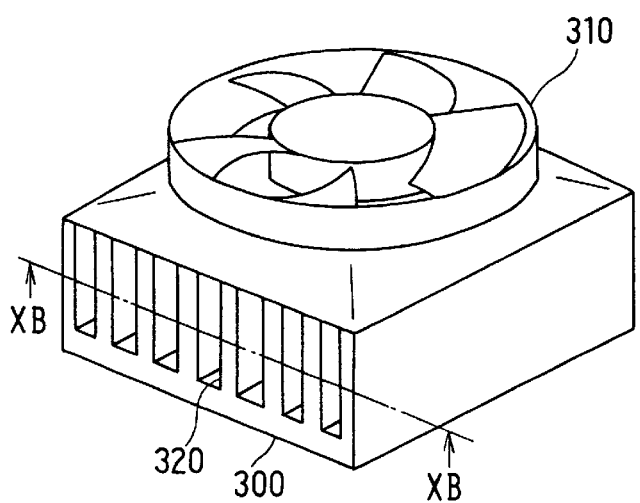
FIG. 10A is a perspective view showing a cooling unit according to a prior art.
Figure 10B:
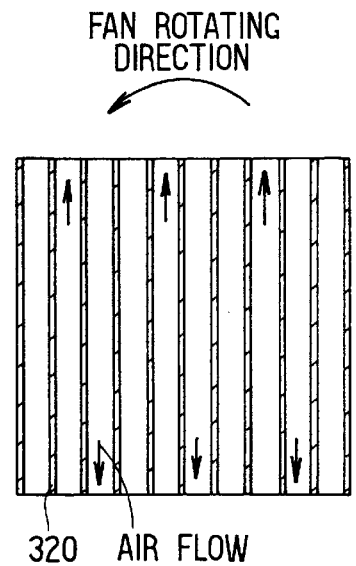
FIG. 10B is a cross-sectional view taken along a XB—XB line in FIG. 10A.

The amount of air flowing in the central portion of the substrate 200 corresponding to the boss part 111 is less than in other areas. In addition, the air flow from the fan 110 inevitably has a component in a rotating direction of the fan 110. Therefore, when fins are simply arranged in parallel with one another as in a conventional manner shown in FIGS. 10A and 10B so that the air flow direction is forcibly changed by the fins into a direction parallel to the fins, the substrate has some areas in which air smoothly flows and others in which air does not smoothly flow. More specifically, the air does not smoothly flow at the central portion of the substrate corresponding to the boss part, so that the temperature at the central portion is increased as compared to the other areas. This causes large pressure loss, biased heat transfer, and a hot-spot. Consequently, the conventional cooling unit uses a large fan having a large blowing capacity, thereby causing an increased size of the fan (cooling unit), increased noise, and high manufacturing cost.

To the contrary, according to this embodiment, the fins 120 have the louvers 130 so that the louvers 130 in the adjacent two of the areas $A_1$ to $A_4$ are arranged to form V-like shape protruding toward the central points O. Therefore, the cooling air blown from the fan 110 toward the fins 120 smoothly flows out even from the central portion of the substrate 200. As a result, a pressure loss in the fins 120 is lessened. It is not necessary to use a large capacity fan, thereby preventing size increase, noise increase, and manufacturing cost increase. Also, because the air flow direction is changed by the louvers 130 on the fins 120, a temperature boundary layer is prevented from being grown on the surfaces of the fins 120, resulting in improvement of heat transfer efficiency. Consequently, the radiation capacity of the cooling unit 100 is improved.

Figure 3:
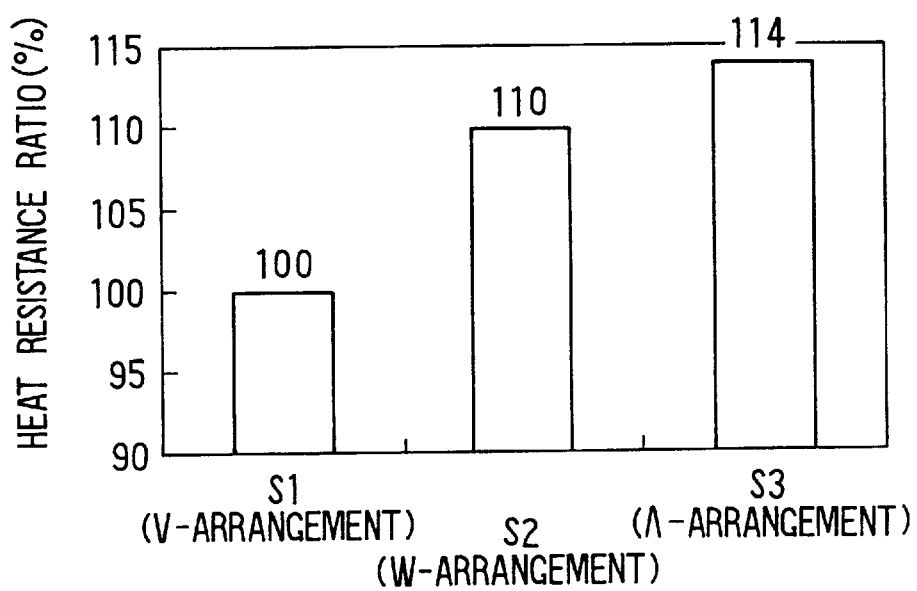
FIG. 3 is a graph showing resistance ratios of cooling units as samples S1, S2, S3, including louvers with variout arrangements.
Figure 4A:
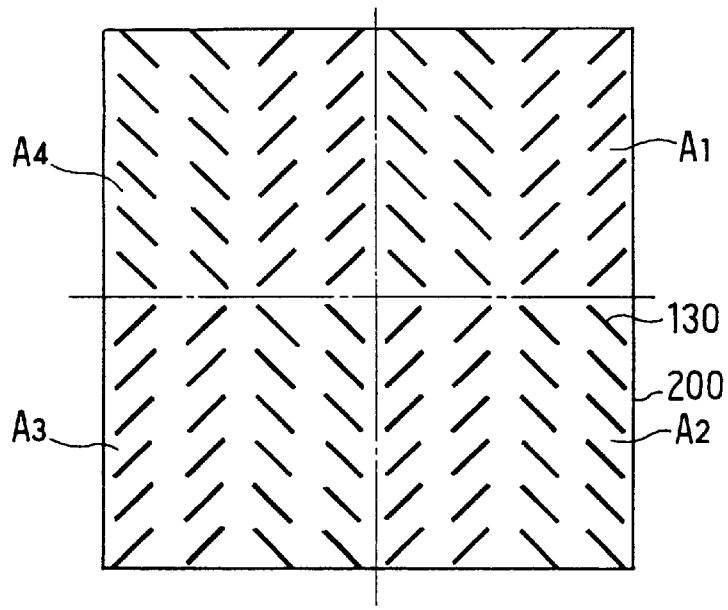
FIGS. 4A and 4B are schmatic views showing the louver arrangements of samples S2 and S3, respectively.
Figure 4B:
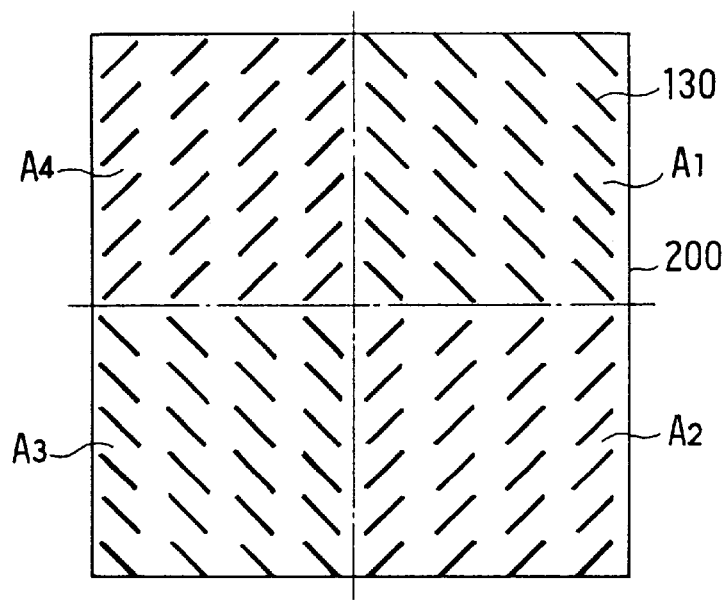

FIG. 3 shows numerical simulation results indicating heat resistance ratios (radiation capacities) at the central portions of the substrates (where the electronic parts are joined to) of samples S1, S2, and S3. Sample S1 has a V-shape arrangement of the louvers 130 as in the first embodiment shown in FIG. 2, sample S2 has a W-shape arrangement of the louvers 130 as shown in FIG. 4A, and sample S3 has a reverse V-shape arrangement of the louvers 130 as shown in FIG. 4B. As understood from FIG. 3, it is confirmed that the heat resistance ratio of sample S1 is smaller than those of the other samples S2, S3. That is, the radiation capacity of sample S1 is higher than those of the other samples S2 and S3. Here, it should be noted that the smaller the heat resistance ratio becomes, the larger the radiation capacity becomes.

Figure 5:
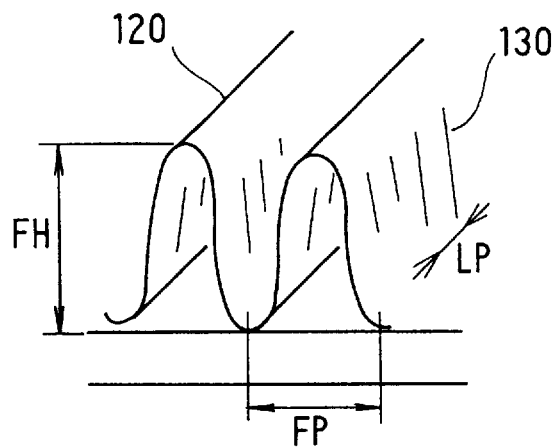
FIG. 5 is an enlarged perspective view showing a fin.

Also, referring to FIG. 5, it is experimentally confirmed that a preferable ratio (FP/LP) of a fin pitch FP of the fins 120 relative to a louver pitch LP of the louvers 130 is in a range of approximately 0.6 to 7.5, and a preferable ratio (FH/FP) of a fin height of the fins 120 relative to the fin pitch FP is in a range of approximately 0.3 to 15. In this embodiment, the louver pitch LP is in a range of 0.8 mm to 3 mm, the fin pitch FP is in a range of 2 mm to 6 mm, and the fin height FH is in a range of 2 mm to 30 mm.

(Second Embodiment)

Figure 6:
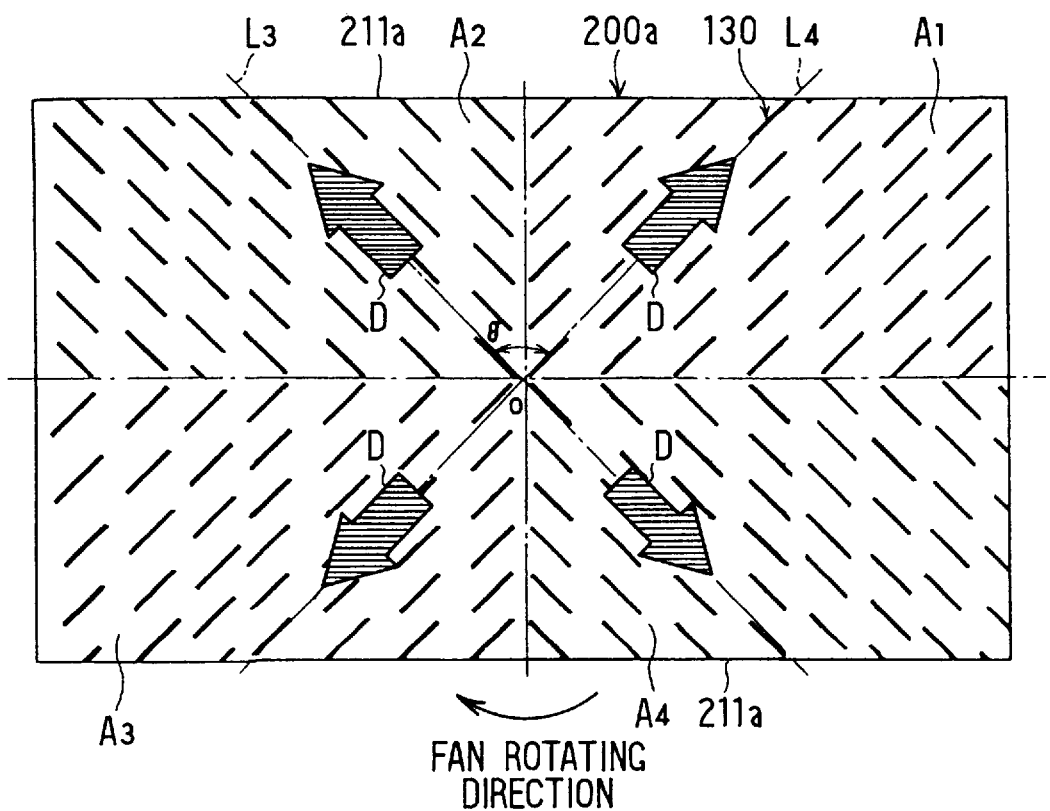
FIG. 6 is a schematic view showing an arrangement of louvers relative to a substrate in a second preferred embodiment.

In a second preferred embodiment, a rectangular substrate 200a is adopted as shown in FIG. 6 in place of the square substrate 200 in the first embodiment described above. As in the first embodiment, the substrate 200a is divided into four areas $A_1$ to $A_4$ around the central point O corresponding to an intersection between two diagonals thereof, and the louvers 130 are arranged in parallel with one another within the respective areas $A_1$ to $A_4$.

In the first embodiment, the reference lines $L_1$, $L_2$ correspond to the diagonals of the substrate 200. To the contrary, in the second embodiment, reference lines $L_3$, $L_4$ do not correspond to the diagonals of the substrate 200a. The reference lines $L_3$, $L_4$ radially elongate to define 45° with outer sides 211a of the substrate 200a. Therefore, directions D of the louvers 130 are inclined at 45° relative to the outer sides 211a similarly to the first embodiment. The other features and effects are the same as those in the first embodiment.

(Third Embodiment)

Figure 7:
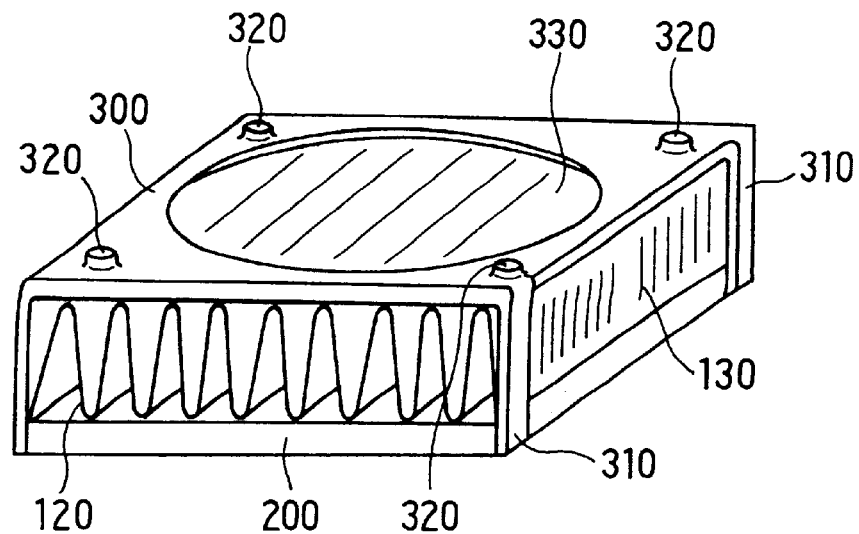
FIG. 7 is a perspective view showing a state of a cooling unit from which a fan is detached, in a third preferred embodiment.

In a third preferred embodiment, assembling performance of the fan 110 and the substrate 200 is improved in the following manner. That is, as shown in FIG. 7, first, the substrate 200 and an aluminum top plate 300 to which the fan 100 is to be fixed are connected to one another with four leg portions 310. In this state, the fins 120 are disposed between the substrate 200 and the top plate 300.

The leg portions 310 are connected to the four corners of the substrate 200 so that cooling air blown from the fan 110 toward the substrate 200 can easily escape from the cooling unit 100. The top plate 300 is formed with partially protruding attachment parts 320 on a side opposite the fins 120 by burring processing. The top plate 300 further has a through hole 330 having a diameter equal to or larger than the diameter of the fan 110. The through hole 330 and the leg portions 310 are integrally formed with the top plate 300 by pressing.

Figure 8:
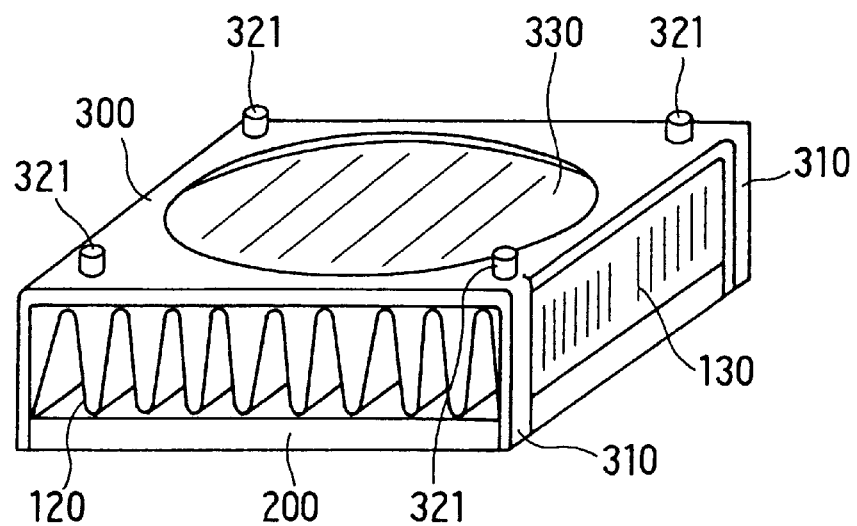
FIG. 8 is a perspective view showing a state of a cooling unit from which a fan is detached, in a modified example of the third embodiment.

The top plate 300, the fins 120, and the substrate 200 are thermally joined to one another by, for instance, brazing. Then, after the fan 110 is positioned relative to the top plate 300 by the attachment parts 320, the fan 110 is inserted (screwed) into a through hole formed by burring processing with screw means (not shown) such as a vis, and is fixed to the top plate 300. In this embodiment, the fan 110 is fixed to the top plate 300 by the screw means; however, the fan 110 may be fitted into protrusions 321 which are formed on the top plate 300 instead of the attachment parts 320 as shown in FIG. 8 so that the fan 110 is fixed to the top plate 300. In this case, the fan 110 can be easily fixed to the top plate 300 without using the screw means.

In this embodiment, the substrate 200 is rectangular; however, the present invention is not limited to this shape.

The substrate can have another shape such as a circle. Therefore, it is not always necessary that the directions D of the louvers 130 (reference lines $L_1$ to $L_4$) are inclined at 45° relative to the outer sides 211 of the substrate 200, and may be inclined at another angle. Although the fins 120 are corrugated with a sine-wave like shape, it may be corrugated with a rectangular-wave like shape. The heat generating member is not limited to the electronic component, and may be the other heat generating members.

Figure 9:
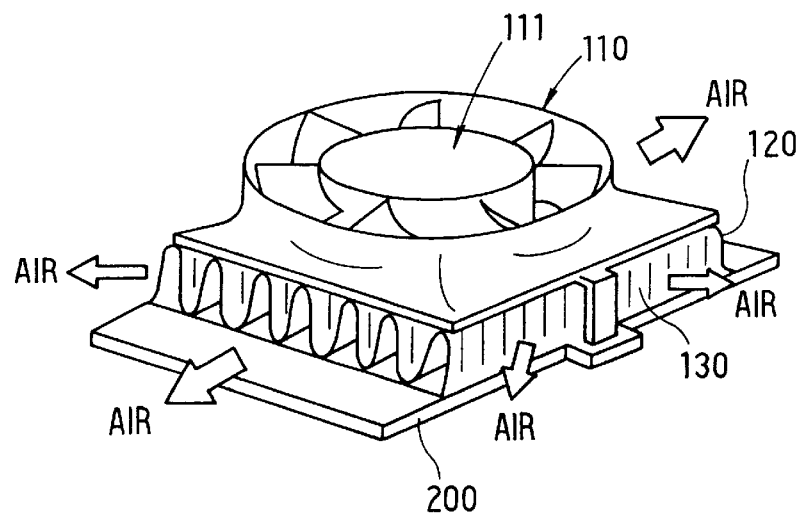
FIG. 9 is a perspective view showing a cooling unit in a modifed embodiment of the present invention.

In the third embodiment, the top plate 300 is fixed to the substrate 200 at the four corners thereof; however, as shown in FIG. 9, it may be fixed to the substrate 200 and to the fan 110 at two portions. In the above-described embodiments, the fan 110 is a so-called forcing type fan that blows air toward the substrate 200. Alternatively, the fan may be a so-called suction type fan that blows air toward a side opposite the substrate 200. In this case, cooling air flows toward the central portion O on the substrate 200 is sucked into the fan, and then is blown out from the cooling unit.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A cooling unit for cooling a heat generating element, comprising:

a substrate to which the heat generating element is to be fixed;

an axial fan for blowing air toward the substrate in a direction approximately perpendicular to a surface of the substrate, the axial fan having a boss part and a plurality of blades disposed around the boss part, the boss part being opposed to a specific point of the substrate; and a cooling fin disposed between the substrate and the axial fan and having a plurality of louvers, wherein the substrate is divided into even substrate areas around the specific point in a rotating direction of the axial fan, the substrate areas each having a reference line that radially extends from the specific point; and wherein each of the plurality of louvers faces one of the substrate areas and extends in a direction parallel to the reference line of the one of the substrate areas, for changing an air flow direction of the air blown from the axial fan to said direction parallel to the reference line.

2. The cooling unit according to claim 1, wherein:

the substrate has a rectangular shape with two diagonals; and the specific point is a central point of the substrate on which the diagonals are crossed with one another.

3. The cooling unit according to claim 2, wherein each of the substrate areas has a reference line that is inclined at 45° relative to one of sides of substrate.

4. The cooling unit according to claim 2, wherein the substrate is square, and is divided into four substrate areas each having the reference line parallel to one of the diagonals.

5. The cooling unit according to claim 1, wherein two reference lines of adjacent two substrate areas make a specific angle therebetween.

6. The cooling unit according to claim 5, wherein the specific angle is 90°.

7. The cooling unit according to claim 1, wherein all louvers facing one of the substrate areas elongate in parallel with the reference line of the one of the substrate areas.

8. A cooling unit for cooling a heat generating element, comprising:

a substrate to which the heat generating element is to be fixed, the substrate being divided into even substrate areas around a central point, the substrate areas each having a reference line that radially extends from the central point;

an axial fan for blowing air toward the substrate by rotating around a portion facing the central point of the substrate; and a cooling fin disposed between the substrate and the axial fan and having a plurality of louvers, the plurality of louvers each facing one of the substrate areas and extending in a direction parallel to a corresponding reference line of the one of the substrate areas, for changing an air flow direction of the air to said direction parallel to a corresponding reference line.

9. The cooling unit according to claim 8, wherein the substrate has a square shape with two diagonals crossed with one another at the central point.

10. The cooling unit according to claim 9, wherein:

the substrate is divided into four substrate areas; and each of the substrate areas has a reference line parallel to either one of the diagonals.

11. The cooling unit according to claim 8, wherein:

the substrate has a rectangular shape with four sides; and each of the substrate areas has a reference line inclined at 45° relative to one of the sides of the substrate.

12. The cooling unit according to claim 8, wherein two reference lines of adjacent two substrate areas make a specific angle therebetween.

13. The cooling unit according to claim 12, wherein the specific angle is 90°.

14. The cooling unit according to claim 8, wherein all louvers facing one of the substrate areas extend in the direction parallel to a corresponding reference line.

15. A cooling unit for cooling a heat generating element, comprising:

a substrate to which the heat generating element is to be fixed, the substrate being divided into at least two substrate areas respectively contacting the specific point, the substrate areas each having a reference line that extends from the specific point and defines a specific angle with an adjacent reference line thereof;

an axial fan for making an air flow flowing in contact with the substrate on a side opposite the heat generating element, by rotating around a portion facing the specific point of the substrate; and a cooling fin disposed between the substrate and the axial fan and having a plurality of louvers, the plurality of louvers each facing one of the substrate areas and extending in parallel with a corresponding reference line of the one of the substrate areas to change the direction of the air flow in a direction parallel to the corresponding reference line.

16. The cooling unit according to claim 15, wherein the substrate has a rectangular shape with diagonals that are crossed with one another at the specific point.

17. The cooling unit according to claim 15, wherein:

the substrate is square; and each of the substrate areas has a reference line parallel to one of the diagonals.

18. The cooling unit according to claim 15, wherein all louvers facing one of the substrate areas extend in a direction parallel to a corresponding reference line.

19. The cooling unit according to claim 15, wherein the axial fan sucks the air flow from a substrate side toward a side opposite the substrate.

* * * * *